(12) United States Patent
Chiricosta et al.

(10) Patent No.: US 7,375,587 B2
(45) Date of Patent: May 20, 2008

(54) VARIABLE-GAIN AMPLIFIER WITH HIGH LINEARITY AS TO GAIN VARIATIONS

(75) Inventors: Mario Chiricosta, Messina (IT); Philippe Sirito-Olivier, Carro par Martigues (FR)

(73) Assignee: STMicroelectronics S.r.l., Agrate Brianza (IT)

( * ) Notice: Subject to any disclaimer, the term of this patent is extended or adjusted under 35 U.S.C. 154(b) by 101 days.

(21) Appl. No.: 11/405,026

(22) Filed: Apr. 14, 2006

(65) Prior Publication Data
US 2006/0273857 A1    Dec. 7, 2006

(30) Foreign Application Priority Data
Apr. 14, 2005    (EP)    ............................ 05425223

(51) Int. Cl.
*H03G 3/10*    (2006.01)
(52) U.S. Cl. .......................................... 330/284; 330/69
(58) Field of Classification Search ................. 330/84, 330/52, 69, 254
See application file for complete search history.

(56) References Cited

U.S. PATENT DOCUMENTS

| | | | |
|---|---|---|---|
| 4,514,702 A | 4/1985 | Zogg | |
| 5,432,478 A * | 7/1995 | Gilbert | ....................... 330/284 |
| 5,684,431 A * | 11/1997 | Gilbert et al. | .............. 330/254 |
| 5,880,631 A | 3/1999 | Sahota | |
| 6,078,219 A | 6/2000 | Hadjichristos et al. | |
| 6,703,892 B1 * | 3/2004 | Capofreddi et al. | ........ 327/538 |
| 7,027,792 B1 * | 4/2006 | Luff et al. | .................. 455/314 |
| 7,031,687 B2 * | 4/2006 | Kivekas et al. | ............. 455/313 |
| 2002/0137486 A1 | 9/2002 | Madni et al. | |
| 2003/0160599 A1 | 8/2003 | Mouret et al. | |
| 2004/0066232 A1 | 4/2004 | Mouret et al. | |

OTHER PUBLICATIONS

European Search Report from European Patent Application 05425223.4, filed Apr. 14, 2005.

* cited by examiner

*Primary Examiner*—Henry Choe
(74) *Attorney, Agent, or Firm*—Lisa K. Jorgenson; James H. Morris; Wolf, Greenfield & Sacks, P.C.

(57) ABSTRACT

A variable-gain amplifier includes an amplifier stage; an attenuating network receiving an input signal; a plurality of transconductance stages, connected between respective nodes of the attenuating network and the amplifier stage, wherein each of the transconductance stages has a differential circuit, configured to supply differential currents to the amplifier stage; and a gain-control circuit for controlling the transconductance stages according to an electrical control quantity. Each of the transconductance stages further includes a current-divider circuit associated to the differential circuit and controlled by the gain-control circuit so as to divide the differential currents between the amplifier stage and a dispersion line proportionally to the control quantity.

13 Claims, 8 Drawing Sheets

US 7,375,587 B2

VARIABLE-GAIN AMPLIFIER WITH HIGH LINEARITY AS TO GAIN VARIATIONS

BACKGROUND OF THE INVENTION

1. Field of the Invention

The present invention relates to a variable-gain amplifier with high linearity as to gain variations.

2. Discussion of the Related Art

In the field of analog electronics, it is known to use variable-gain amplifiers when signals of very different amplitudes on particularly wide frequency bands are to be processed. In these cases, variable-gain amplifiers enable adapting the amplitude of the output signal to the specific working conditions, preventing saturation of the downstream-connected stage and without degrading the linearity of the signal.

Variable-gain amplifiers of the type designated by the reference number 1 in FIG. 1, are known. They include an attenuating network 2, a plurality of transconductance stages 3, a constant-gain amplifier 5, and a gain-control stage 6, which is associated to the transconductance stages 3. The attenuating network 2 is of the ladder resistive type and receives an input voltage $V_{IN}$ on inputs 2a, 2b. The transconductance stages 3 have first inputs each connected to a respective node 2c of the attenuating network 2 and second inputs connected to the output of the constant-gain amplifier 5 through a feedback line 7. The outputs of the transconductance stages 3 are connected to an input of the constant-gain amplifier 5. The gain-control stage 6 supplies a total constant biasing current $I_B$, which is split among the transconductance stages 3 in a proportion indicated by a control voltage $V_C$. In practice, it is possible to control the weight of each transconductance stage 3 for driving the constant-gain amplifier 5. The overall gain of the variable-gain amplifier 1 is greater when one of the transconductance stages 3 closest to the inputs 2a, 2b of the attenuating network 2, receiving the least attenuated input voltage $V_{IN}$, prevails, and smaller when one of the transconductance stages 3 furthest from the inputs 2a, 2b prevails. The overall gain of the variable-gain amplifier 1 can thus be controlled over a wide range of values.

Known variable-gain amplifiers have, however, some drawbacks, in particular because the conditions of biasing and thus the transconductance of the individual transconductance stages vary. Even though it is possible to obtain a good linearity between the control voltage and the overall gain (designated, respectively, by $V_C$ and A in the plot of FIG. 2a), however, the harmonic distortion, for example, the third-order one, disadvantageously has an irregular pattern as the control voltage varies. In this connection, see the plot of FIG. 2b, where the third-order harmonic distortion is designated by HD3.

SUMMARY OF THE INVENTION

One aim of the present invention is to provide a variable-gain amplifier that will be free from the drawbacks described.

According to the present invention, a variable-gain amplifier is provided, comprising an amplifier stage; an attenuating network, that can receive an input signal; a plurality of transconductance stages connected between respective nodes of the attenuating network and said amplifier stage, wherein each of said transconductance stages comprises a differential circuit, configured for supplying differential currents to said amplifier stage; and a gain-control circuit for controlling said transconductance stages according to an electrical control quantity; wherein each of said transconductance stages comprises a current-divider circuit associated with said differential circuit and controlled by said gain-control circuit so as to divide said differential currents between said amplifier stage and a dispersion line in proportions that vary according to said control quantity.

For a better understanding of the invention, some embodiments thereof are now described, purely by way of a non-limiting example and with reference to the attached drawings, wherein.

DETAILED DESCRIPTION

Figure 1:
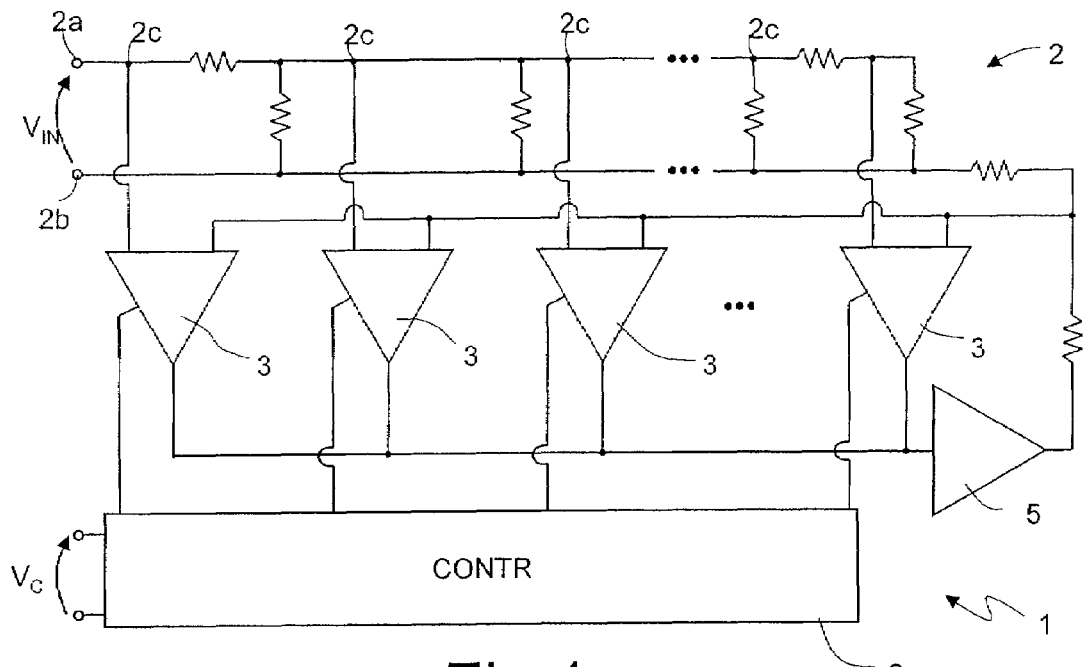
FIG. 1 shows a simplified circuit diagram of a variable-gain amplifier of a known type.
Figure 2A:
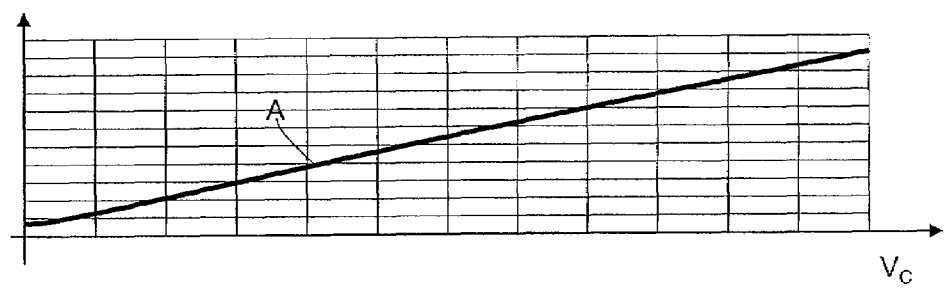
FIGS. 2a, 2b are plots of quantities of the amplifier of FIG. 1.
Figure 2B:
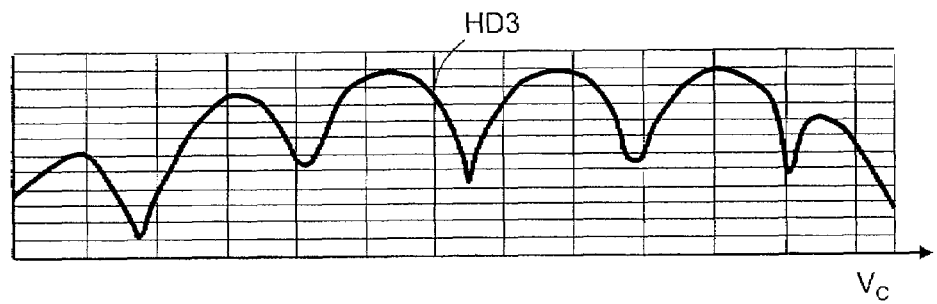
Figure 3:
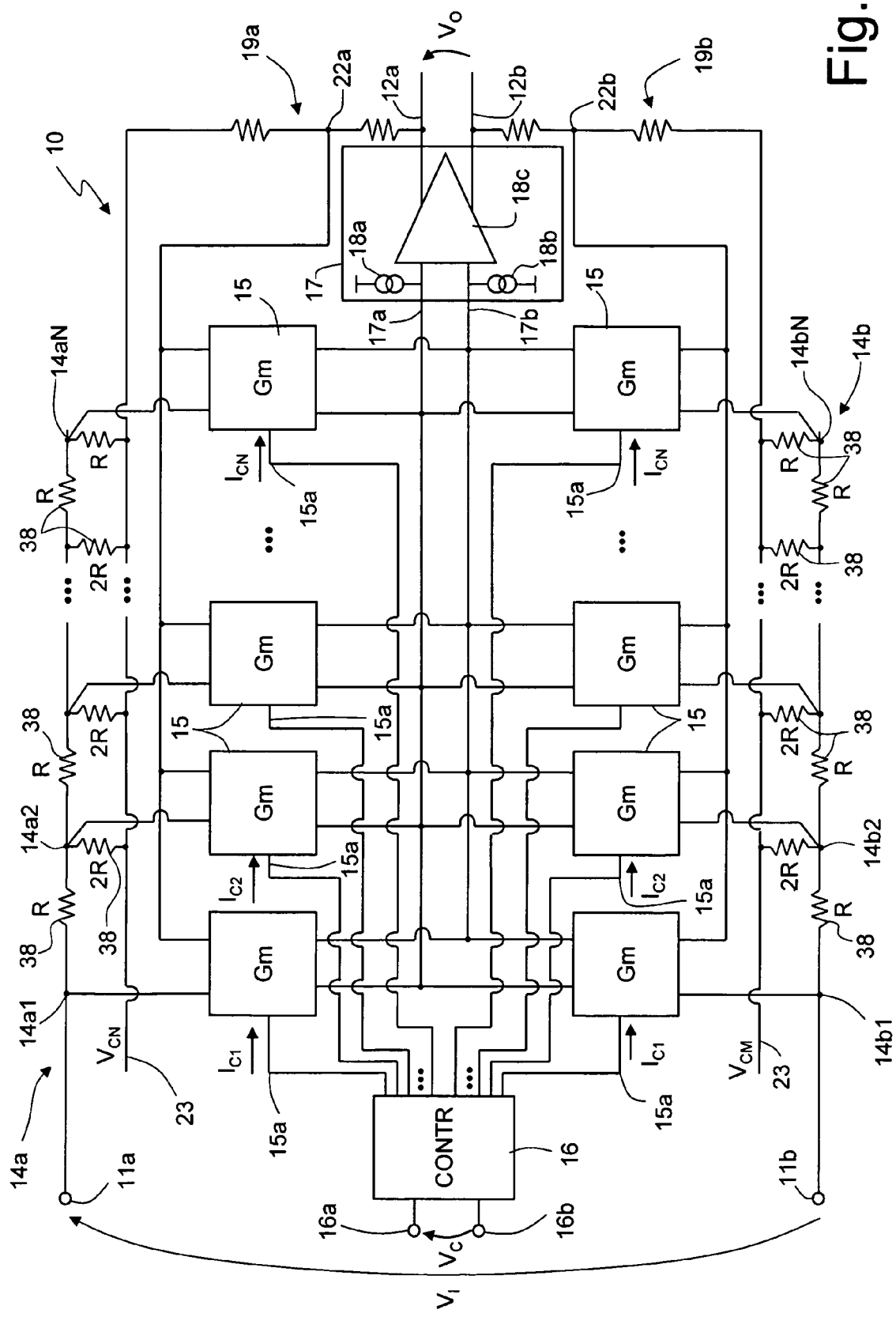
FIG. 3 shows a simplified block diagram of a variable-gain amplifier provided according to a first embodiment of the present invention.

FIG. 3 shows a variable-gain amplifier 10 having a fully differential topology (i.e., having differential inputs and outputs). In particular, the variable-gain amplifier 10 has a first input terminal 11a and a second input terminal 11b, receiving from outside an input voltage $V_I$, and a first output terminal 12a and a second output terminal 12b, supplying an output voltage $V_O$. The output voltage $V_O$ and the input voltage $V_I$ are linked by the relation:

$$V_O = A\, V_I$$

where A is the overall gain of the variable-gain amplifier 10.

The variable-gain amplifier 10 comprises a first attenuating network 14a and a second attenuating network 14b, a plurality of transconductance stages 15, an amplifier stage 17 and a gain-control circuit 16 for controlling the overall gain A on the basis of a control voltage $V_C$, which may preferably be varied between a positive maximum value $+V_C^*$ and a negative minimum value $-V_C^*$. The variable-gain amplifier 10 further includes a first feedback network 19a and a second feedback network 19b.

The amplifier stage 17 is a current-to-voltage converter of the fully differential type, the gain whereof is independent of the control voltage $V_C$. In particular, the amplifier stage 17 has a first input 17a and a second input 17b and a first and a second output, which form, respectively, the first output 12a and the second output 12b of the variable-gain amplifier 10. Furthermore, the amplifier stage 17 comprises a differential amplifier 18c and a first current source 18a and a second current source 18b respectively connected to the first and second inputs 17a, 17b.

The first and second feedback networks 19a, 19b are connected between a respective one of the outputs 12a, 12b of the variable-gain amplifier 10 and a common-mode line 23, which, in a per se known manner, is kept at a common-mode voltage $V_{CM}$ that is substantially constant and intermediate between a positive supply voltage $V_{DD}$ and a negative supply voltage $V_{EE}$. The first and second feedback networks 19a, 19b include respective resistive dividers, intermediate nodes whereof define a first feedback node 22a and a second feedback node 22b, respectively.

The first and second attenuating networks 14a, 14b are of the ladder resistive type, for example, R-2R networks, are connected to the first and second inputs 11a, 11b, respectively, and have respective reference terminals connected to the common-mode line 23. The first and second attenuating networks 14a, 14b have a plurality of respective nodes 14a1, 14a2, ..., 14aN, 14b1, 14b2, ..., 14bN. Of these, the initial nodes 14a1, 14b1 are directly connected to the first and second inputs 11a, 11b, respectively. On the remaining nodes 14a2, ..., 14aN, 14b2, ..., 14bN progressively attenuated voltages are present.

The transconductance stages 15 are identical to each other. A first set of N transconductance stages 15 has first input terminals connected to respective nodes 14a1, 14a2, ..., 14aN of the first attenuating network 14a, and second input terminals connected to the first feedback node 22a. A second set of N transconductance stages 15 have first input terminals connected to respective nodes 14b1, 14b2, ..., 14bN of the second attenuating network 14b and second input terminals connected to the second feedback node 22. In addition, all the transconductance stages 15 have first and second output terminals, connected to the first input 17a and to the second input 17b, respectively, of the amplifier stage 17.

The gain-control stage 16 has input terminals 16a, 16b, receiving a control voltage $V_C$, and a plurality of output terminals connected to control terminals 15a of respective transconductance stages 15. The control voltage $V_C$ is supplied from outside, for example by a control unit of a known type and not illustrated herein. In addition, the gain-control circuit 16 supplies, to the transconductance stages 15, respective control currents $I_{C1}, I_{C2}, \ldots, I_{CN}$ correlated to the control voltage $V_C$, as explained hereinafter.

The transconductance stages 15 provide drive current to the amplifier stage 17. Based on the control currents $I_{C1}, I_{C2}, \ldots, I_{CN}$, the gain-control stage 16 determines the weight of each transconductance stage 15 in the driving of the amplifier stage 17. More precisely, the gain-control stage 16 selects a transconductance stage 15 that is prevalent in the first set of N transconductance stages 15 (connected to the first attenuating network 14a) and a corresponding one in the second set of N transconductance stages 15 (connected to the second attenuating network 14b). The adjacent transconductance stages 15 provide progressively decreasing contributions, the further they are connected from the prevalent transconductance stage 15, until they are substantially without any effect. The overall gain A of the variable-gain amplifier 10 depends upon which transconductance stages 15 are selected for supplying the prevalent contribution. In particular, if transconductance stages 15 connected to nodes 14a1, 14a2, ..., 14aN, 14b1, 14b2, ..., 14bN of the attenuating networks 14a, 14b close to the inputs 11a, 11b of the variable-gain amplifier 10 are selected, the overall gain A is greater; instead, if transconductance stages 15 connected to nodes 14a1, 14a2, ..., 14aN, 14b1, 14b2, ..., 14bN of the attenuating networks 14a, 14b distant from by the inputs 11a, 11b of the variable-gain amplifier 10 are selected, the overall gain A is smaller.

Figure 4:
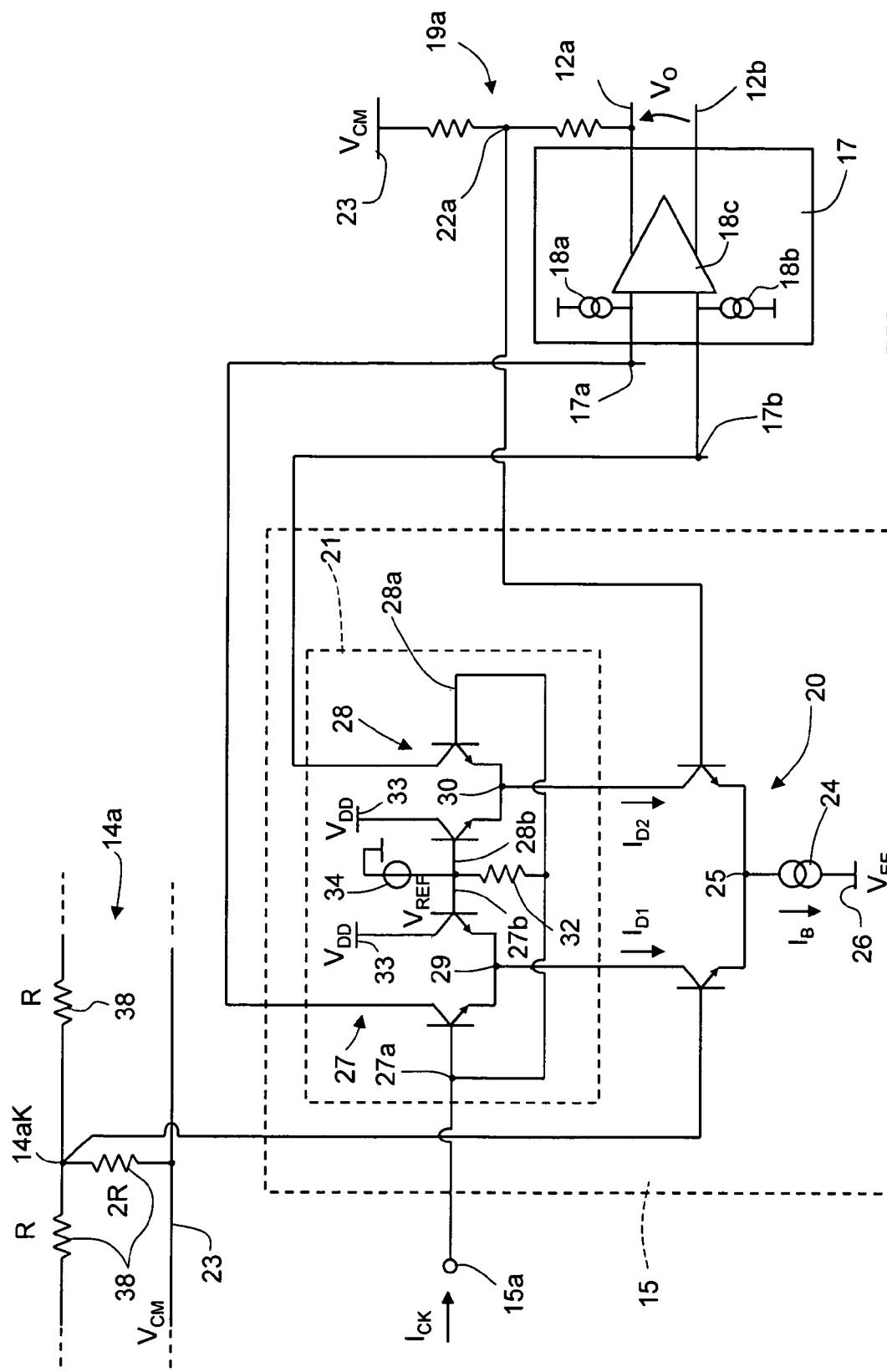
FIG. 4 is a more detailed circuit diagram of a first block of the amplifier of FIG. 3.

FIG. 4 illustrates in detail one of the transconductance stages 15, which, as mentioned previously, are identical to each other. In particular, the transconductance stage 15 of FIG. 4 is connected to one of the nodes of the first attenuating network 14a, herein designated by 14aK, and comprises a driving differential pair 20 and a current-divider circuit 21. The driving differential pair 20 has a first input and a second input, which form the inputs of the transconductance stage 15 and are connected to the node 14aK and, respectively, to the first feedback node 22a. A first output and a second output of the driving differential pair 20 are connected to the current-divider circuit 21. A biasing-current source 24, supplying a biasing current $I_B$, is connected between a biasing terminal 25 of the driving differential pair 20 and a negative supply line 26, set to the negative supply voltage $V_{EE}$.

The current-divider circuit 21 comprises a first dividing differential pair 27 and a second dividing differential pair 28, which have respective biasing terminals 29, 30 connected to the first output and, respectively, to the second output of the driving differential pair 20. The first inputs 27a, 28a of the first dividing differential pair 27 and of the second dividing differential pair 28 are directly connected to each other and form the control terminal 15a of the transconductance stage 15. Second inputs 27b, 28b of the first and second dividing differential pairs 27, 28 are directly connected to each other and are further connected to the first and second inputs 27a, 28a through a resistor 32. In addition, a reference-voltage source 34, supplying a reference voltage $V_{REF}$, is connected to the second inputs 27b, 28b. First outputs of the first and second dividing differential pairs 27, 28 form the outputs of the transconductance stage 15, and are connected to the first input 17a and, respectively, to the second input 17b of the amplifier stage 17. Second outputs of the first and second dividing differential pairs 27, 28 are connected to a positive supply line 33, which supplies the positive supply voltage $V_{DD}$. In the embodiment of the invention described herein, the driving differential pair 20, the first dividing differential pair 27 and the second dividing differential pair 28 are all of NPN-bipolar-transistor type.

Operation of the transconductance stages 15 is described hereinafter. The biasing current $I_B$ supplied by the biasing-current source 24 is divided between the two branches of the driving differential pair 20 on the basis of a differential voltage $V_D$ at its inputs. Thus, a first differential current $I_{D1}$ and a second differential current $I_{D2}$ flow in the branches of the driving differential pair 20 and are supplied to the first and, respectively, second dividing differential pairs 27, 28 of the current-divider circuit 21. In turn, the current-divider circuit 21 divides the differential currents $I_{D1}, I_{D2}$ between its own outputs (i.e., towards the inputs 17a, 17b of the amplifier stage 17) and the positive supply line 33, according to the value of the control current $I_{CK}$ supplied by the gain-control stage 16. In fact, the first and second dividing differential pairs 27, 28 receive equal differential voltages, which are determined by the intensity of the current flowing through the resistor 32 and thus by the control current $I_{CK}$. In addition, the differential currents $I_{D1}, I_{D2}$ are divided between the inputs 17a, 17b of the amplifier stage 17 and the positive supply line proportionally to the control current $I_{CK}$ and, in practice, to the control voltage $V_C$. In detail, if the control current $I_{CK}$ is zero, the differential currents $I_{D1}, I_{D2}$ are divided substantially in equal parts between the inputs 17a, 17b of the amplifier stage 17 and the positive supply line 33. As the control current ICK increases (positive current of increasing intensity), the differential currents $I_{D1}, I_{D2}$ are divided to a greater extent on the inputs 17a, 17b of the amplifier stage 17; instead, as the control current $I_{CK}$ decreases (negative current of increasing intensity), the differential currents $I_{D1}, I_{D2}$ are divided to a greater extent on the positive supply line 33. The fraction of the differential currents ID1, ID2 divided on the positive supply line 33 is dispersed and does not contribute to controlling the overall gain A.

In practice, the current-divider circuit 21 enables a variation in the contribution of each transconductance stage 15 without altering the biasing conditions of the driving differential pair 20. Advantageously, then, the overall gain A of the variable-gain amplifiers 10 can be selected in a wide range of values, without introducing significant irregularities in the behavior of the harmonic distortion.

Figure 5:
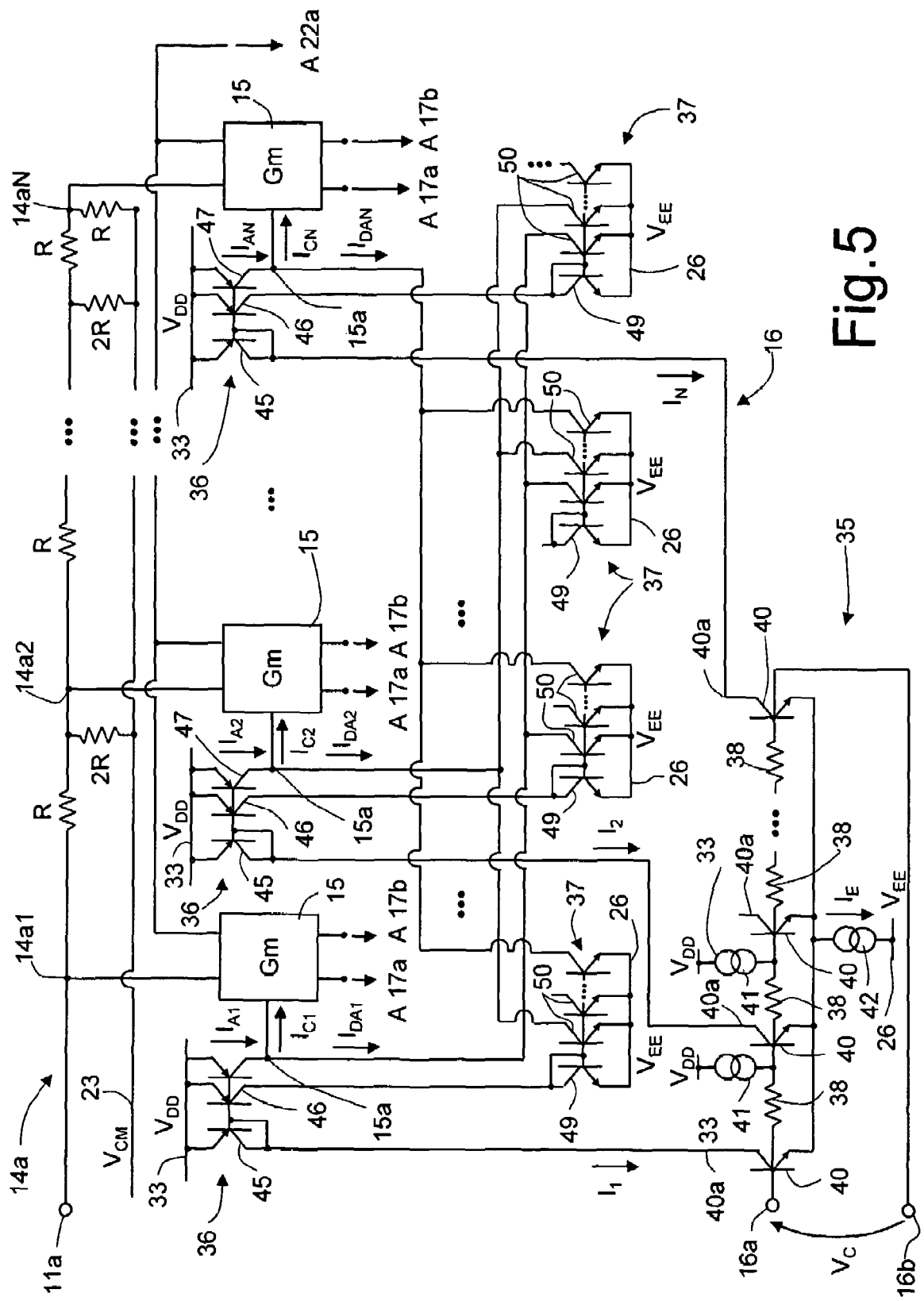
FIGS. 5 and 6 are more detailed circuit diagrams of a second block of the amplifier of FIG. 1.
Figure 6:
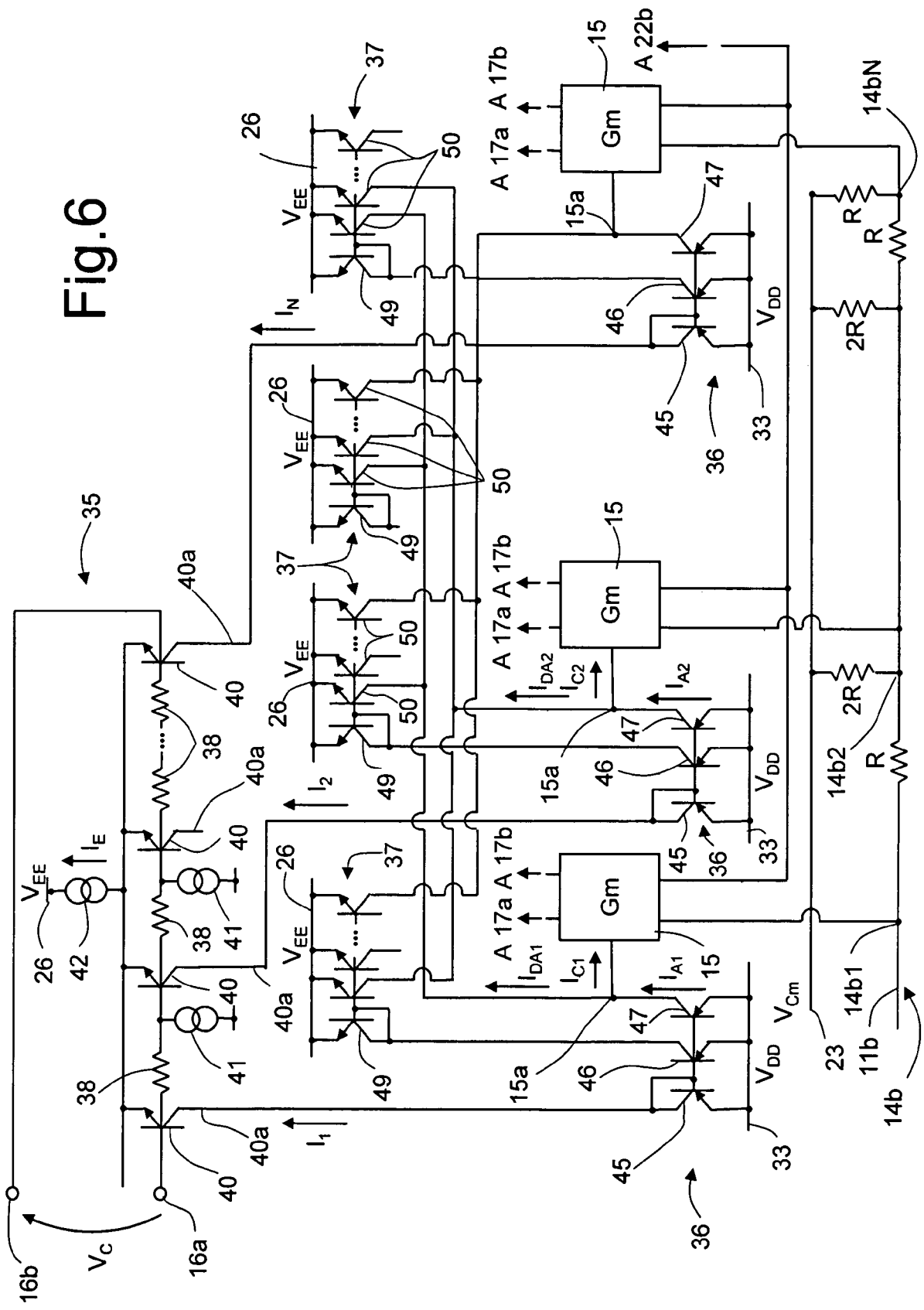

FIG. 5 shows a first portion of the gain-control stage 16, in particular associated with the transconductance stages 15 of the first set (connected to the first attenuating network 14a). A second portion of the gain-control stage 16, symmetrical to the first, is illustrated in FIG. 6 and is not described in detail. The gain-control stage 16 comprises a control deviator circuit 35, a plurality of driving circuits 36, each associated with a respective transconductance stage 15, and a plurality of deactivation circuits 37.

The control deviator circuit 35, known per se, comprises a chain of equal resistors 38, a plurality of deviator transistors 40, and a common-current source 42, which supplies an emitter current $I_E$. Opposite ends of the chain of resistors 38 form input terminals 16a, 16b of the gain-control stage 16 and receive the control voltage $V_C$. In addition, base-current sources 41 are connected to intermediate nodes of the chain of resistors 38. The deviator transistors 40 have base terminals connected to respective nodes (intermediate or end nodes) of the chain of resistors 38 and emitter terminals connected to the common-current source 42. The collector terminals 40a of the deviator transistors 40 are each connected to the control terminal 15a of a respective transconductance stage 15 through a respective driving circuit 36. In greater detail, driving circuits 36, having a current-mirror configuration, have an input transistor 45, connected to the respective deviator transistor 40, and a first output transistor 46 and a second output transistor 47. The first output transistor 46 is connected to a respective deactivation circuit 37, while the second output transistor 47 is connected to the control terminal 15a of the respective transconductance stage 15.

The deactivation circuits 37 are current mirrors with scaled multiple outputs and are controlled by the current supplied by the respective driving circuits 36. Each deactivation circuit comprises an input transistor 49, connected to the first output transistor 46 of the corresponding driving circuit 36, and a plurality of output transistors 50. The output transistors 50 of each deactivation circuit 37 are connected to the control terminals 15a of respective transconductance stages 15, different from the transconductance stage 15 associated with the deactivation circuit 37. In addition, the output transistors 50 are scaled so as to have different mirror ratios with the input transistor 49. The output transistors 50 having a smaller mirror ratio are connected to closer transconductance stages 15 (i.e., are connected to nodes 14a1, 14a2, . . . , 14aN of the attenuating network 14a closest to the node 14a1, 14a2, . . . , 14aN connected to the transconductance stage 15 associated with the deactivation circuit 37 that includes the output transistors 50); instead, the output transistors 50 having a higher mirror ratio are connected to more distant transconductance stages 15 (i.e., they are connected to nodes 14a1, 14a2, . . . , 14aN of the attenuating network 14a more distant from the node 14a1, 14a2, . . . , 14aN connected to the transconductance stage 15 associated with the deactivation circuit 37 that includes the output transistors 50). For example, in the deactivation circuit associated with the transconductance stage 15 connected to the node 14a1 (FIG. 5), the output transistors 50 have a mirror ratio with the input transistor 49 respectively equal to 1:1, 2:1, . . . , $2^{N-1}$:1; in the deactivation circuit associated with the transconductance stage 15 connected to the node 14a2 (FIG. 5), the output transistors 50 have a mirror ratio with the input transistor 49 of 1:1 (output transistor 50 connected to the transconductance stage 15, in turn connected to the node 14a1), 1:1 (output transistor 50 connected to the transconductance stage 15, in turn connected to the node 14a3), . . . , $2^{N-2}$:1 (output transistor 50 connected to the transconductance stage 15, in turn connected to the node 14aN).

In practice, then, the control terminal 15a of each of the transconductance stages 15 is connected to the second output transistor 47 of the respective driving circuit 36 and to one of the output transistors 50 of each of the deactivation circuits 37 associated with the other transconductance stages 15.

Figure 7A:
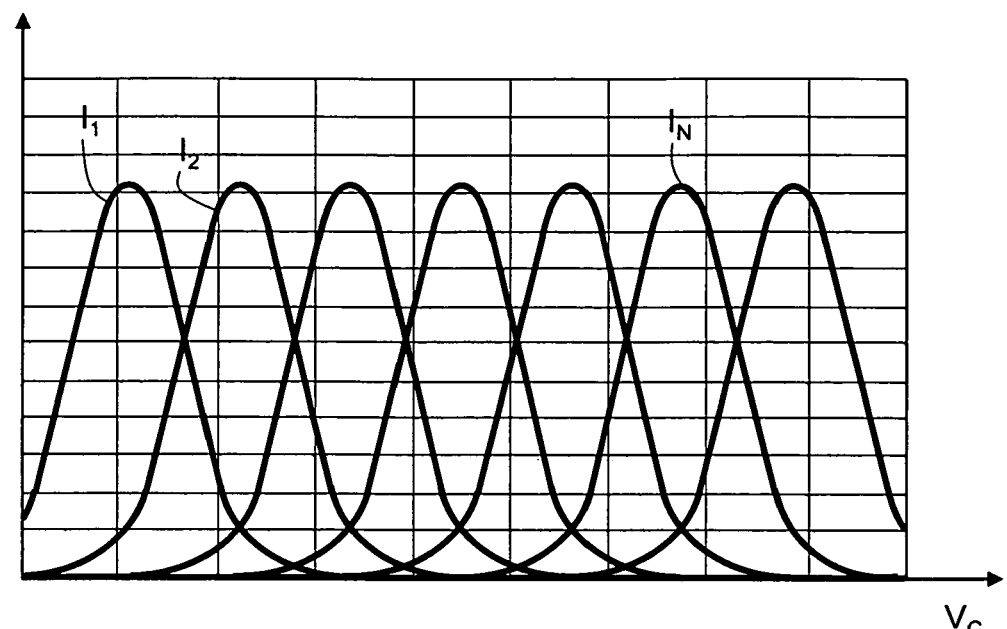
FIGS. 7a and 7b are plots of quantities of the amplifier of FIG. 3.

Operation of the gain-control stage 16 is described hereinafter. The control deviator circuit 35 divides the emitter current $I_E$ among adjacent deviator transistors 40, proportionally to the value of the control voltage $V_C$ (FIG. 5). More precisely, the control deviator circuit 35 is configured in such a way that currents $I_1, I_2, \ldots, I_N$ flowing in each of the deviator transistors 40 have a bell-shaped curve as a function of the control voltage $V_C$, as illustrated in FIG. 7a. In particular, the current curves of the deviator transistors 40 partially overlap and have staggered maxima. Consequently, only some adjacent deviator transistors 40 are on (for example three), while the others are substantially off.

The driving circuits 36 connected to the deviator transistors 40 that are conducting supply the control terminals 15a of the respective transconductance stages 15 with respective activation currents $I_{A1}, I_{A2}, \ldots, I_{AN}$ correlated to the currents $I_1, I_2, \ldots, I_N$ that flow in the deviator transistors 40. For simplicity, we shall assume that in the diagram of FIG. 5 the deviator transistor 40 that controls the transconductance stage 15 connected to the node 14a1 is activated in a prevalent way and, secondarily, the deviator transistor 40 that controls the transconductance stage 15 connected to the node 14a2. In this case, the activation current $I_{A1}$ is higher than the activation current $I_{A2}$, and the other activation currents are progressively smaller until they become substantially negligible for the most distant transconductance stages 15. The deactivation stage 37 associated with the transconductance stage 15 connected to the node 14a1 absorbs respective currents from the control terminals 15a of all the other transconductance stages 15. Said currents are larger as distance from the transconductance stages 15 increases. The deactivation circuit associated with the transconductance stage 15 connected to the node 14a2 operates in the same way, and thus draws a current from the control terminal 15a of the transconductance stage 15 connected to the node 14a1. The other deactivation circuits 37 are substantially without any effect.

In practice, from the control terminals 15a of each transconductance stage 15 a respective deactivation current $I_{DA1}, I_{DA2}, \ldots, I_{DAN}$ is drawn, which is due to the contributions of all the deactivation circuits 37 associated with the other transconductance stages 15 (of the same set). Each deactivation circuit 37 associated with a respective transconductance stage 15 intervenes for disabling the other transconductance stages 15 (of the same set). The action of each deactivation circuit 37 is related to the intensity of the activation current $I_{A1}, I_{A2}, \ldots, I_{AN}$ supplied to the transconductance stage 15 associated thereto: the greater the activation current $I_{A1}, I_{A2}, \ldots, I_{AN}$, the more intense the effect of the corresponding deactivation circuit 37. In addition, the action of the deactivation circuits 37 is more intense on the more distant transconductance stages 15 (more precisely, on the transconductance stages 15 connected to more distant nodes 14a of the first attenuating network 14a).

Figure 7B:
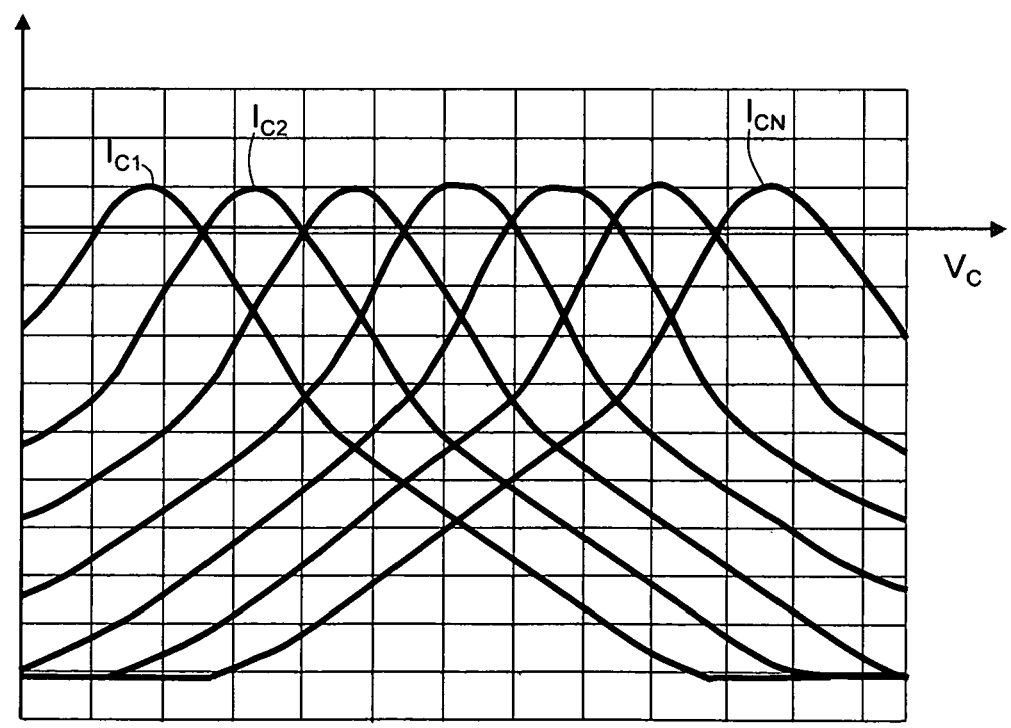

The control currents $I_{C1}, I_{C2}, \ldots, I_{CN}$ are determined by the difference between the corresponding activation and deactivation currents supplied to the control terminal 15a and, in practice, present a bell-shaped curve, as illustrated in FIG. 7b. The transconductance stages 15 contribute to forming the output voltage $V_O$ to a different extent, according to the intensity of the respective control currents $I_{C1}, I_{C2}, \ldots, I_{CN}$, as already explained with reference to FIG. 4.

In this way, the transconductance stages 15 that do not take part in controlling the overall gain A of the variable-gain amplifier 10 are excluded and do not make any contribution to the output voltage $V_O$. However, each of the transconductance stages 15 is always correctly biased and the biasing conditions do not change. Advantageously, then, the amplitude of the range of values in which it is possible to select the overall gain A is maximized, maintaining at the same time a high linearity.

Figure 8:
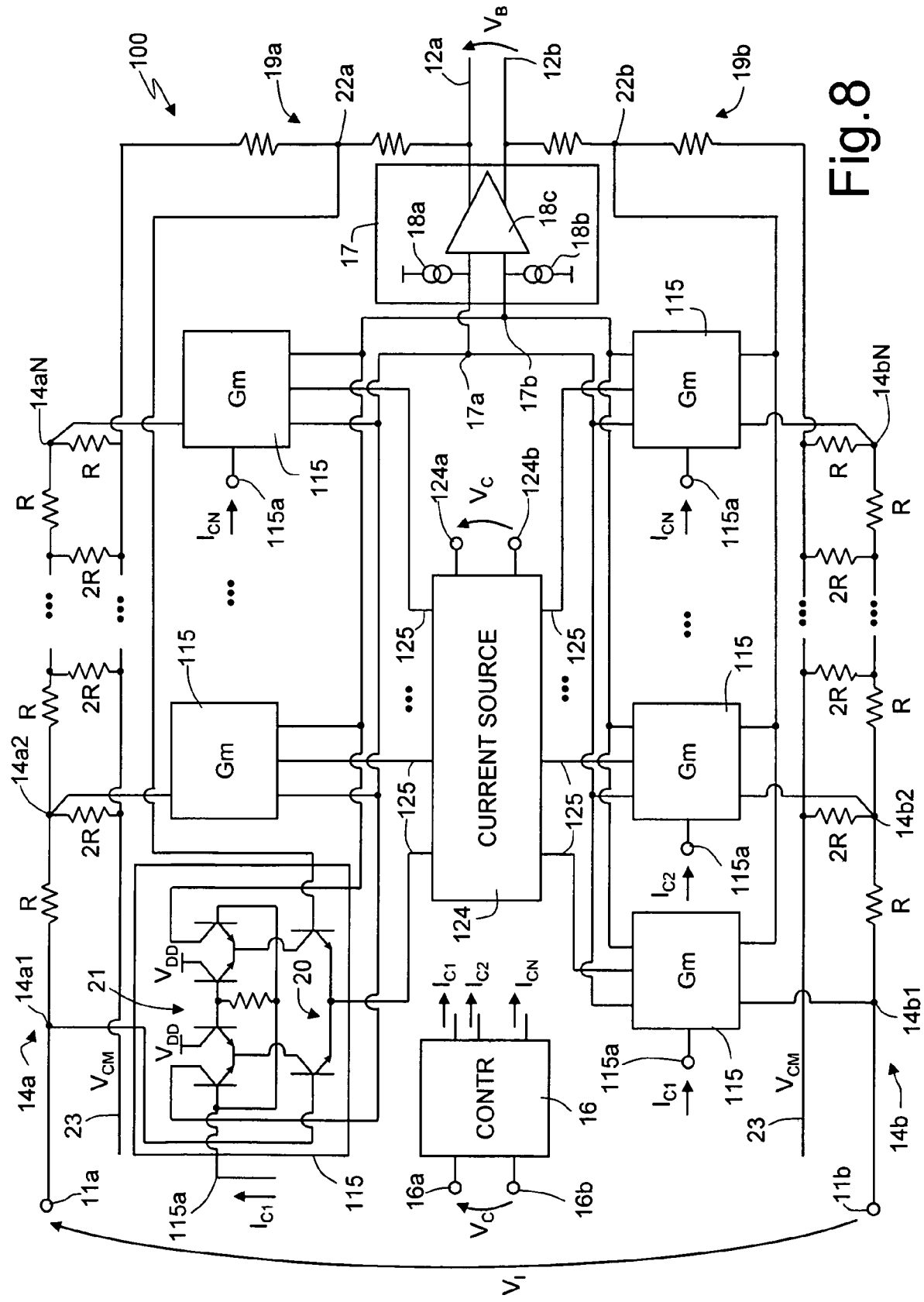
FIG. 8 is a simplified block diagram of a variable-gain amplifier according to a second embodiment of the present invention.
Figure 9:
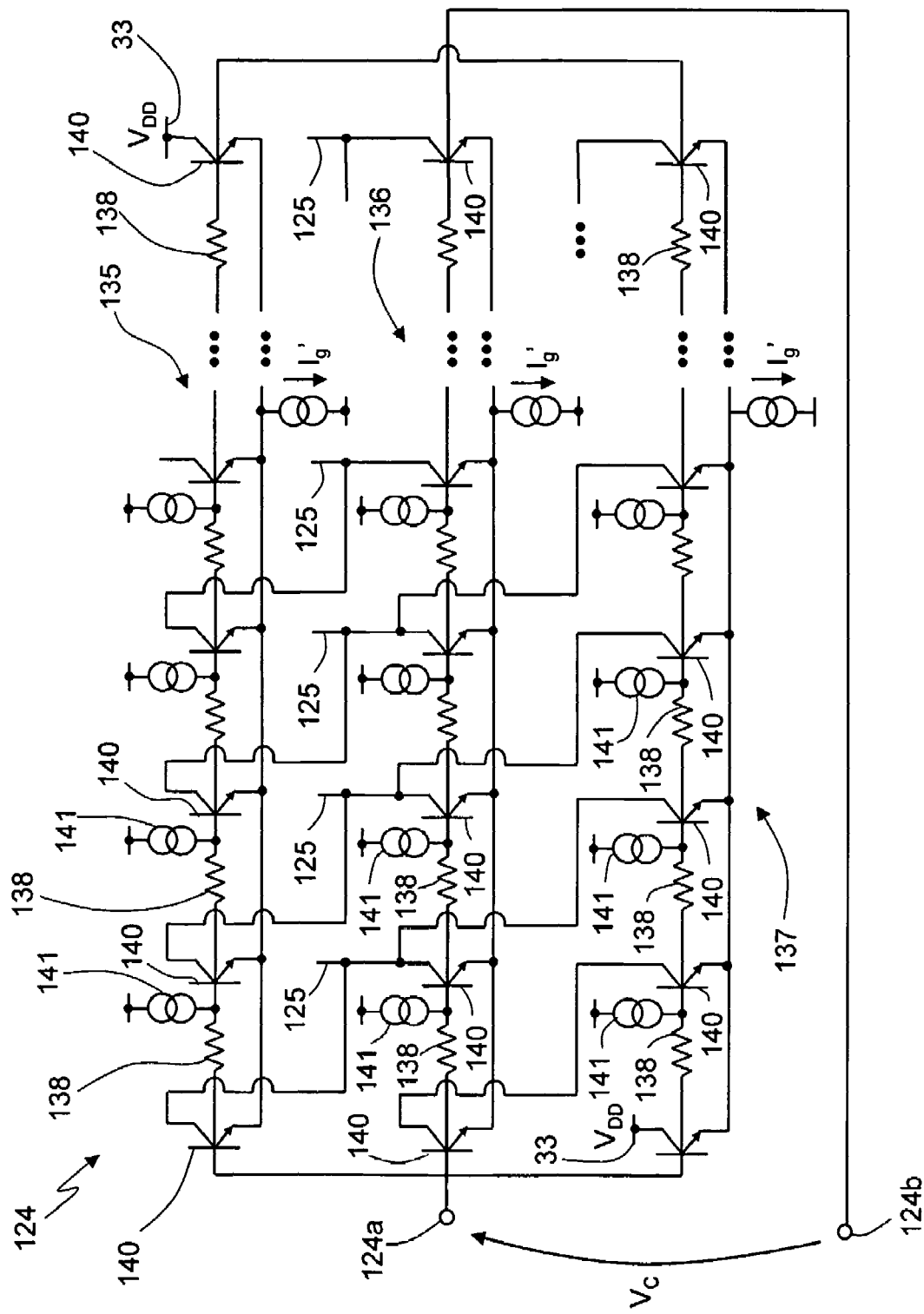
FIG. 9 is a more detailed circuit diagram of a part of the amplifier of FIG. 8.

FIGS. 8 and 9, wherein parts in common with parts already illustrated are designated by the same reference numbers, show a different embodiment of the invention. In this case, a variable-gain amplifier 100 comprises the first and second attenuating networks 14a, 14b, a plurality of transconductance stages 115, the gain-control circuit 16, the amplifier stage 17, the first and second feedback networks 19a, 19b and a current-source stage 124, controlled by the control voltage $V_C$.

The transconductance stages 115 each comprise a respective driving differential pair 20 and a respective current-divider circuit 21, as already described. However, the biasing terminals 25 of the driving differential pairs 20 of the transconductance stages 115 are connected to respective conduction terminals 125 of the current-source stage 124.

With reference to FIG. 9, the current-source stage 124 comprises a first biasing-deviator circuit 135, a second biasing-deviator circuit 136 and a third biasing-deviator circuit 137, which have substantially the same structure as the control deviator circuit 35 and are connected in parallel between a first input terminal 124a and a second input terminal 124b, which receive the control voltage $V_C$.

The first, second and third biasing-deviator circuits 135, 136, 137 each comprise a chain of resistors 138 equal to each other, a plurality of deviator transistors 140, and a common-current source 142, supplying an emitter current $I_B'$. Opposite ends of the chain of resistors 38 are connected to the first input terminal 124a and, respectively, to the second input terminal 124b. In addition, base current sources 141 are connected to intermediate nodes of each chain of resistors 138. The deviator transistors 140 have base terminals connected to respective (intermediate or end) nodes of the respective chains of resistors 138, and emitter terminals connected to the respective common current source 142. The collector terminals of the deviator transistors 140 of the second biasing-deviator circuit 136 form the conduction terminals 125 of the current-source stage 124 and are connected to the biasing terminals 25 of the differential pairs of respective transconductance stages 115 (see FIG. 8). In addition, each deviator transistor 140 of the second biasing-deviator circuit 136 has the collector terminal connected to the collector terminal of the deviator transistor 140 of the first biasing-deviator circuit 135, which, with respect to the chain of resistors 138, is located by one position closer to the first input terminal 124a and connected to the collector terminal of the deviator transistor 140 of the third biasing-deviator circuit 137, which, with respect to the chain of resistors 138, is located by one position closer to the second input terminal 124b. The deviator transistor 140 of the first biasing-deviator circuit 135, directly connected to the second input terminal 124b, and the deviator transistor 140 of the third biasing-deviator circuit 137, directly connected to the first input terminal 124a, have their collector terminals connected to the positive supply line 33.

When the control deviator circuit 35 selects one of the transconductance stages 115 (for each set) as prevalent, the driving differential pair 20 of the same transconductance stage 115 receives the maximum biasing current from the current-source stage 124, in particular from the second biasing-deviator circuit 136. However, also the adjacent transconductance stages 115, which supply a significant contribution to the control of the overall gain A, receive respective substantially equal biasing currents from the first and the third biasing-deviator circuits 135, 137 and consequently operate in optimal biasing conditions. In this way, the harmonic distortion is minimized, and the overall power consumption of the variable-gain amplifier 100 is advantageously reduced.

Finally, it is clear that modifications and variations may be made to the variable-gain amplifier described herein, without departing from the scope of the present invention. In particular, it is evident that the invention can be advantageously exploited also for obtaining variable-gain amplifiers with single output, rather than with a fully differential topology.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A variable-gain amplifier, comprising:
   an amplifier stage;
   an attenuating network, that can receive an input signal;
   a plurality of transconductance stages connected between respective nodes of the attenuating network and said amplifier stage, wherein each of said transconductance stages comprises a differential circuit, configured for supplying differential currents to said amplifier stage; and
   a gain-control circuit for controlling said transconductance stages according to an electrical control quantity;
   wherein each of said transconductance stages comprises a current-divider circuit associated to said differential circuit and controlled by said gain-control circuit so as to divide said differential currents between said amplifier stage and a dispersion line in proportions that vary according to said control quantity;
   wherein said control circuit comprises a current-deviator circuit controlled by said electrical control quantity, for dividing a common current among said divider circuits of said transconductance stages proportionally to said electrical control quantity.

2. The amplifier according to claim 1, wherein said current-divider circuit comprises a first differential pair and a second differential pair having biasing terminals connected to respective outputs of said differential circuit for receiving said differential currents.

3. The amplifier according to claim 2, wherein said first and second differential pairs comprise first outputs, connected to a first input and, respectively, a second input of said amplifier stage, second outputs connected to said dispersion line, and a control terminal for dividing said differential currents between said first outputs and said second outputs.

4. The amplifier according to claim 2, wherein said first and second differential pairs have first inputs directly connected to each other, second inputs directly connected to each other, and a resistive element connected between said first inputs and said second inputs.

5. The amplifier according to claim 1, wherein said deviator circuit comprises a common current source, supplying said common current, a plurality of conduction terminals, each associated with a respective transconductance stage, and input terminals for receiving said electrical control quantity and dividing said common current among said conduction terminals, proportionally to said electrical control quantity.

6. The amplifier according to claim 5, wherein said conduction terminals of said current-deviator circuit are connected to the divider circuits of the respective transconductance stages through respective driving circuits.

7. A variable-gain amplifier, comprising:
an amplifier stage:
an attenuating network, that can receive an input signal:
a plurality of transconductance stages connected between respective nodes of the attenuating network and said amplifier stage, wherein each of said transconductance stages comprises a differential circuit, configured for supplying differential currents to said amplifier stage; and
a gain-control circuit for controlling said transconductance stages according to an electrical control quantity;
wherein each of said transconductance stages comprises a current-divider circuit associated to said differential circuit and controlled by said gain-control circuit so as to divide said differential currents between said amplifier stage and a dispersion line in proportions that vary according to said control quantity;
wherein said control circuit comprises a current-deviator circuit controlled by said electrical control quantity, for dividing a common current among said divider circuits of said transconductance stages proportionally to said electrical control quantity:
wherein said gain-control circuit comprises a plurality of deactivation circuits, each associated with a respective transconductance stage and actuatable for deactivating at least one of the remaining transconductance stages.

8. The amplifier according to claim 7, wherein each of said deactivation circuits comprises an input transistor, connected to the respective associated transconductance stage for detecting a passage of current towards said respective associated transconductance stage, and a plurality of output transistors, controlled by said input transistor and connected to the said remaining transconductance stages for picking up deactivation currents when a passage of current towards said respective associated transconductance stage is detected.

9. The amplifier according to claim 7, wherein said deactivation circuits comprise current mirrors with scaled multiple outputs.

10. A variable-gain amplifier, comprising:
an amplifier stage:
an attenuating network, that can receive an input signal;
a plurality of transconductance stages connected between respective nodes of the attenuating network and said amplifier stage, wherein each of said transconductance stages comprises a differential circuit, configured for supplying differential currents to said amplifier stage; and
a gain-control circuit for controlling said transconductance stages according to an electrical control quantity;
wherein each of said transconductance stages comprises a current-divider circuit associated to said differential circuit and controlled by said gain-control circuit so as to divide said differential currents between said amplifier stage and a dispersion line in proportions that vary according to said control quantity;
wherein said control circuit comprises a current-deviator circuit controlled by said electrical control quantity, for dividing a common current among said divider circuits of said transconductance stages proportionally to said electrical control quantity;
wherein each of said transconductance stages includes a respective biasing current source supplying a biasing current independent of said electrical control quantity.

11. The amplifier according to claim 1, comprising a current source stage controlled by said electrical control quantity, wherein each of said transconductance stages is connected to a respective conduction terminal of said current source stage for receiving a respective biasing current according to said electrical control quantity, and wherein said current source stage is configured for supplying substantially equal biasing currents to at least two adjacent transconductance stages, selected according to said electrical control quantity.

12. The amplifier according to claim 11, wherein said current source stage comprises a first biasing deviator circuit, a second biasing deviator circuit and a third biasing deviator circuit, connected in parallel between a first input terminal and a second input terminal receiving said electrical control quantity;
wherein said first biasing deviator circuit, second biasing-deviator circuit, and third biasing-deviator circuit each comprise a chain of resistors equal to each other, a common current source, a plurality of deviator transistors, which have control terminals connected to respective nodes of said chain of resistors and first conduction terminals connected to said common current source, and a plurality of base current sources associated with respective deviator transistors;
and wherein the deviator transistors of said second biasing deviator circuit have second conduction terminals connected to respective transconductance stages and further connected to second conduction terminals of respective deviator transistors of said first biasing deviator circuit, which, in the respective chain of resistors, is located by one position closer to the first input terminal, and to second conduction terminals of respective deviator transistors of said third biasing deviator circuit, which, in the respective chain of resistors, is located by one position closer to the second input terminal.

13. The amplifier according to claim 1, wherein said amplifier stage has a gain independent of said electrical control quantity.

* * * * *

UNITED STATES PATENT AND TRADEMARK OFFICE
CERTIFICATE OF CORRECTION

PATENT NO. : 7,375,587 B2 Page 1 of 1
APPLICATION NO. : 11/405026
DATED : May 20, 2008
INVENTOR(S) : Mario Chiricosta et al.

It is certified that error appears in the above-identified patent and that said Letters Patent is hereby corrected as shown below:

Title Page,
Item (73) should read:
(73) Assignees: STMicroelectronics S.r.l., Agrate Brianza, Italy and
STMicroelectronics S.A., Montrouge, France Signed and Sealed this Twentieth Day of January, 2009

JON W. DUDAS
*Director of the United States Patent and Trademark Office*